United States Patent
Adachi

(10) Patent No.: US 8,410,691 B2
(45) Date of Patent: Apr. 2, 2013

(54) ORGANIC EL DEVICE

(75) Inventor: Kazuya Adachi, Hino (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/058,332

(22) PCT Filed: Sep. 29, 2009

(86) PCT No.: PCT/JP2009/066886
§ 371 (c)(1),
(2), (4) Date: Apr. 17, 2012

(87) PCT Pub. No.: WO2011/039830
PCT Pub. Date: Jul. 4, 2011

(65) Prior Publication Data
US 2012/0194061 A1     Aug. 2, 2012

(51) Int. Cl.
*H01L 51/54* (2006.01)
(52) U.S. Cl. .................. 313/512; 313/504; 445/25
(58) Field of Classification Search .............. 313/504, 313/512; 445/25; 257/100; 252/62.3 R
See application file for complete search history.

(56) References Cited

U.S. PATENT DOCUMENTS

| 2003/0164677 | A1  | 9/2003  | Miyaguchi et al. |         |
|--------------|-----|---------|------------------|---------|
| 2004/0113542 | A1* | 6/2004  | Hsiao et al.     | 313/504 |
| 2005/0218803 | A1  | 10/2005 | Takeuchi et al.  |         |
| 2007/0164666 | A1* | 7/2007  | Oosono et al.    | 313/504 |
| 2007/0228944 | A1* | 10/2007 | Oosono et al.    | 313/504 |
| 2009/0075098 | A1* | 3/2009  | Tsukahara et al. | 428/451 |
| 2009/0256467 | A1* | 10/2009 | Yamazaki et al.  | 313/504 |

FOREIGN PATENT DOCUMENTS

| JP | 2000-223264 A   | 8/2000  |
| JP | 2001-176653 A   | 6/2001  |
| JP | 2002-134268 A   | 5/2002  |
| JP | 2004-063304 A   | 2/2004  |
| JP | 2005-183147 A   | 7/2005  |
| JP | 2005-285659 A   | 10/2005 |
| JP | 2006-278230 A   | 10/2006 |
| JP | 2008-226472 A   | 9/2008  |
| JP | 2009-076232 A   | 4/2009  |
| WO | WO-2009-099009 A1 | 8/2009 |

\* cited by examiner

*Primary Examiner* — Mary Ellen Bowman
(74) *Attorney, Agent, or Firm* — Rabin & Berdo, P.C.

(57) ABSTRACT

An organic EL device includes a substrate; an organic EL element formed on the substrate; and a sealing film formed on the organic EL element that is a CVD-deposited silicon nitride film containing from 0.85 at % to 0.95 at % H. A method of manufacturing the organic EL device includes the steps of: forming an organic EL element on a substrate; and forming a sealing film on the organic EL element in a process including mixing $SiH_4$, $NH_3$, $N_2$, and $H_2$, during which the $H_2$ is introduced at a flow rate set to from 1 volume percent to 5 volume percent of that of the $N_2$, so that a silicon nitride film containing hydrogen atoms or hydrogen molecules is formed.

10 Claims, 2 Drawing Sheets

ORGANIC EL DEVICE

BACKGROUND OF THE PRIOR ART

1. Field of the Invention

The present invention relates to an organic EL device which is useful in display applications, and to a method of manufacturing such a device.

2. Background of the Related Art

In recent years, much research has been performed on organic EL devices using self-emissive organic EL elements for display applications. It is anticipated that organic EL devices will realize high emission luminance and emission efficiency. This is because high current densities can be realized at low voltages. In particular, commercialization of a multicolor emissive organic EL device with high fineness and capable of full-color display is anticipated in the field of display technology.

An important problem for commercialization of organic EL devices as color displays include, in addition to the realization of high fineness, is long-term stability, including color reproducibility. This is because multicolor emissive organic EL devices have the drawback that the emission characteristics (current-luminance characteristics) decline significantly as a result of driving over a constant period.

A representative cause of this decline in emission characteristics is the growth of dark spots. A "dark spot" is means an emission defect point. Such a dark spot is thought to occur due to the presence of oxygen and moisture in elements which cause the advancement of oxidation or agglomeration of material in a constituent layer of the organic EL element, during driving and during storage. Growth of a dark spot advances not only during the passing of current but during storage as well. In particular, dark spot growth is thought to be (1) accelerated by oxygen or water existing in the outer environment surrounding the element; (2) affected by oxygen or water existing in adsorbents in constituent layers; and (3) affected by water adsorbed onto components used in device manufacture or by intrusion of water during manufacture. If this growth continues, the dark spot may spread over the entire emissive face of the organic EL device.

In the prior art, methods in which metal cans and glass plates are used to seal organic EL elements, or methods in which a desiccant is arranged in the space in which an organic EL element has been sealed, have been employed as means of preventing intrusion of water into the constituent layers of organic EL elements. However, in order to exploit such features of organic EL devices as light weight and thin shape, techniques to use thin films for sealing, without using desiccants, are attracting attention.

As thin films for sealing, silicon oxide, silicon nitride, silicon oxide-nitride, and similar are used. For example, in Japanese Patent Application Laid-open No. 2001-176653 (Patent Reference 1), a film for sealing which uses silicon oxide is disclosed. However, silicon oxide is inferior with respect to permeability of oxygen and water, and so cannot suppress the occurrence of dark spots. In Japanese Patent Application Laid-open No. 2005-183147 (Patent Reference 2), a film for sealing which employs silicon nitride is disclosed. However, in Patent Reference 2 there is no disclosure of means for sealing particles or of means for suppressing the occurrence of cracks. Further, in Japanese Patent Application Laid-open No. 2005-285659 (Patent Reference 3) a film for sealing which employs $SiH_4$, $N_2$, and $NH_3$ as reaction gases is disclosed. In Japanese Patent Application Laid-open No. 2004-63304 (Patent Reference 4), a film for sealing which employs $SiH_4$, $N_2$, and $H_2$ as reaction gases is disclosed.

In an organic EL device, and in particular a device with a bottom-emission type structure, a color filter layer and CCM layer (color conversion layer) are formed on a glass substrate, and a planarization layer (overcoat layer) is formed using a polyimide silicon resin or another organic resin to bury the steps therein. Further, in order to prevent dispersion of residual water from this planarization layer into the organic EL layer, a passivation layer of $SiO_2$, SiN, or similar is provided. Then, a transparent electrode of ITO, IZO or similar is formed into stripe shapes as anodes, and thereupon a cathode-separating layer with a reverse-taper shape is formed into stripe shapes perpendicular to the transparent electrodes. Then, the organic EL layer which is the emission layer is formed, and a reflective electrode of aluminum or similar is formed thereupon as a cathode. Because the organic EL layer which is the emission layer is extremely susceptible to oxygen and water, if air or water intrudes from portions which are peeled slightly or from defect portions of the cathode to reach the organic EL layer, growth of emission defect points such as DAs (Dark Areas) or DSes (Dark Spots) results. Further, there are concerns that the cathode (reflective electrode) may also be oxidized, and that conductivity and reflectivity may be worsened. Hence in general, in a chamber in which oxygen and water are suppressed to the extent possible, an absorbent and cover glass or another sealing substrate are sealed using ultraviolet-hardening epoxy resin or similar, to prevent intrusion of air and water. However, in a sealing method employing cover glass or another sealing substrate, the absorbent is inserted in a position opposing the organic EL device, and so such a method is not suited to organic EL devices having a top-emission type structure in which light is extracted from the upper portion.

This invention was devised in light of the above problems, and has as an object the provision of an organic EL device with excellent barrier properties with respect to water and oxygen, and which moreover can prevent degradation of the organic EL element, as well as a method of manufacturing such a device.

SUMMARY OF THE INVENTION

This invention has been devised in order to resolve the above problems, and provides an organic EL device, comprising: a substrate; an organic EL element formed on the substrate; and a sealing film formed on the organic EL element, wherein the sealing film is a silicon nitride film containing from 0.85 to 0.95 at % H. The silicon nitride film may have a film thickness ranging from 1000 to 5000 nm. The silicon nitride film may have an absolute value of an internal stress that is 50 MPa or lower.

Further, this invention provides a method of manufacturing the above organic EL device, comprising the steps of: forming an organic EL element on a substrate; and forming a sealing film on the organic EL element in a process including mixing $SiH_4$, $NH_3$, $N_2$, and $H_2$ during which the $H_2$ is introduced at a flow rate set to from 1 to 5 volume percent of that of the $N_2$ so that a silicon nitride film containing hydrogen atoms or hydrogen molecules is formed.

In this invention, an organic EL device with excellent barrier properties with respect to water and oxygen, and which moreover can prevent degradation of the organic EL element, as well as a method of manufacturing such a device, can be provided.

DETAILED DESCRIPTION OF THE INVENTION

Figure 1:
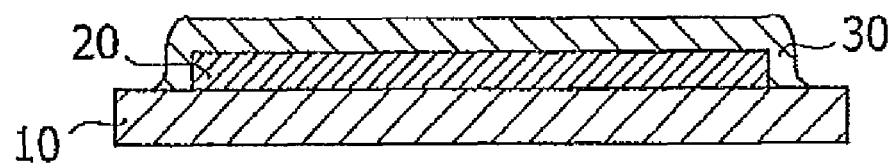
FIG. 1 is a summary diagram showing an organic EL device of the invention.

FIG. 1 is a summary view showing an organic EL device of the invention. The organic EL device of the invention includes at least a substrate 10, an organic EL element 20 formed on the substrate 10, and a sealing film 30 formed on the organic EL element 20.

No limitations in particular are imposed on the substrate 10, which can be formed using any widely used arbitrary material. The substrate can be formed using an arbitrary material which can withstand the various conditions used in forming other constituent layers (for example, solvents used, temperatures, and similar). Further, it is desirable that the substrate have excellent dimensional stability. Transparent materials used to form the substrate include glass, or polyolefins, polymethyl methacrylate or other acrylic resins, polyethylene terephthalate or other polyester resins, polycarbonate resins, polyimide resins, and other resins. When the above-described resins are used, the transparent substrate 10 may be rigid, or may be flexible. Or, in the case of a top-emission type organic EL device in particular, the substrate may be formed using silicon, ceramics, or other opaque materials. A flat material which is insulating and has rigidity capable of maintaining the shape of the organic EL element can be used in formation.

No limitations in particular are imposed on the organic EL element 20, and any widely used arbitrary material can be used in formation to comprise an organic EL layer enclosed between two electrodes.

The sealing film 30 is formed on the organic EL element 20 in order to prevent permeation of oxygen and water into the organic EL element 20. A sealing film 30 in this invention is silicon nitride ($SiN_x$). A sealing film 30 can be formed using a method such as a CVD method. Formation of a sealing film 30 is film deposition onto an organic EL element 20. For this reason, it is preferable that the final film deposition temperature be held to 100° C. or lower, in order not to impart damage to the organic EL element 20 during film deposition.

Further, in order to suppress permeation of oxygen and water, a silicon nitride film with a dense film texture is effective as the sealing film 30. To this end, it is preferable that the film deposition rate of the silicon nitride film be made 2.8 nm/sec or lower during film deposition using a CVD method.

As adjustment of the film deposition rate, for example by raising the Rf output of the CVD device and increasing the flow rate of the reaction gas ($SiH_4$, $NH_3$, $N_2$), the film deposition rate can be raised. Raising the film deposition rate, that is, shortening the film deposition processing time, has an effect on the coverage properties and passivation properties of the sealing film. At a film deposition rate of 2.8 nm/sec, the silicon nitride film reliably covers a pattern with depressions and protrusions. If the film deposition rate exceeds 3.0 nm/sec, portions of the silicon nitride film with a reduced film thickness are seen at depressions and protrusions. At a film deposition rate of 3.58 nm/sec, fine cracks are observed at corner portions of depressions and protrusions (Table 1). Hence in order to preserve passivation properties, it is preferable that the film deposition rate for the silicon nitride film be 3.0 nm/sec or less, and still more preferably 2.8 nm/sec or less. It is preferable that the lower limit to the film deposition rate be 2.1 nm/sec, because too slow a rate will result in lowered productivity.

In this invention, by adding hydrogen ($H_2$ gas) as a reaction gas during film deposition of silicon nitride film, the sealing film 30 is made to react less readily with water. This is because, through addition of a certain quantity of hydrogen, dangling bonds at the surface of the silicon nitride film are reduced, and the silicon nitride molecular state is stabilized. The $SiH_4$ gas and $NH_3$ gas supplied to the CVD device are decomposed into radical molecules in the film deposition chamber, and by bonding once again accumulate as a silicon nitride ($SiN_x$) film on the substrate. In actuality, hydrogen (H) is also incorporated into the silicon nitride film, which can also be called an SiNH film. The H content of the SiNH film depends on the mixing ratio of the $SiH_4$ gas and the $NH_3$ gas which are the reaction gases; the amount of hydrogen absorbed varies with the mixing ratio of these reaction gases. Hence the H content of the SiNH film can be changed through the additional flow rate of $H_2$ gas. The additional flow rate of $H_2$ gas is from 1 to 5 volume percent of the flow rate of the $N_2$ gas which is a reaction gas. When within this range, the H content of the silicon nitride film (SiNH film) is from 0.85 to 0.95 at% (atomic percent). At 1 volume percent or less, the amount of permeating water increases, and if 5 volume percent is exceeded, a color change in the silicon nitride film is seen, and there is an increase in the amount of water permeation due to further reduction of coverage properties. The H content of the silicon nitride film can be measured using the RBS analysis method.

On the other hand, the existence of particles is one factor in the occurrence of DAs (Dark Areas) and DSes (Dark Spots). When a sealing film 30 does not completely cover a particle, and when the coverage properties of a sealing film 30 are poor, the sealing film 30 allows permeation of water or oxygen, which develop into DAs or DSes. In particular, in a mode in which the sealing film 30 is present on a second electrode of the organic EL element 20, when particles occur during formation of the second electrode and during formation of an electrode separation wall, the sizes of large particles are approximately 1 μm. In order to seal such particles, it is preferable that the film thickness of the sealing film 30 be from 1 to 5 μm, and still more preferable that the film thickness lower limit be 3 μm. If the film thickness exceeds 5 μm, there is an increase in particles from the silicon nitride film itself, and in some cases the film may not be suitable as a sealing film.

Further, because there are large internal stresses in silicon nitride films, there are concerns that cracks or separation of silicon nitride film may occur due to changes over time. Hence it is preferable that when using a CVD method to deposit a silicon nitride film, the gas pressure be adjusted such that the absolute value of the internal stress is 50 MPa or lower. Here, when the stress is on the positive side, force on the silicon nitride film acts in the tension direction, and when the stress is on the negative side, force on the silicon nitride film acts in the compression direction. If the stress exceeds positive 50 MPa, the entire silicon nitride film separates, and if less than negative 50 MPa, cracks occur over the entire face of the silicon nitride film. Internal stress is measured using an optical non-contact bowing measuring method.

Figure 2:
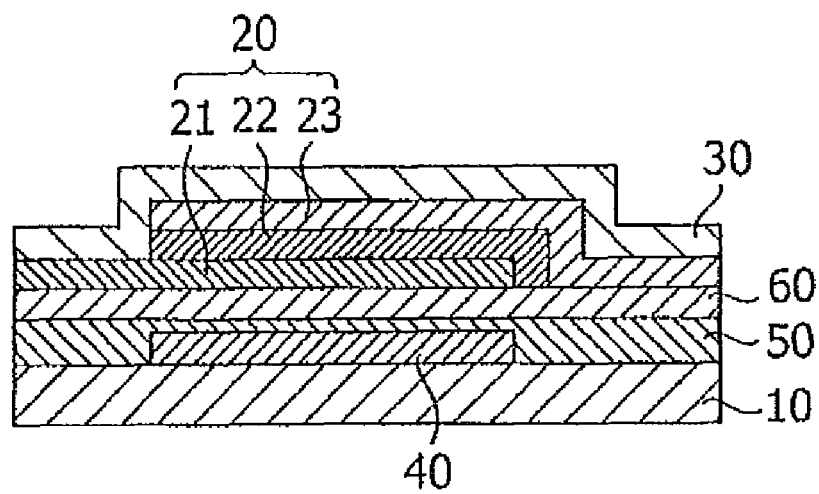
FIG. 2 is a cross-sectional view showing one example of an organic EL device of the invention.

Below, an organic EL device of the invention is explained based on the example shown in FIG. 2. FIG. 2 is one example of an organic EL device of the invention. The organic EL device of FIG. 2 is a bottom-emission type organic EL device. However, the invention is not limited thereto.

The substrate 10 may further include, on the surface thereof, a plurality of switching elements (TFTs and similar) and wiring. This configuration is effective for manufacturing an active matrix-driven type organic EL device having a plurality of independent emission portions.

A first electrode 21 positioned between the substrate 10 and the organic EL layer 22, and a second electrode 23 positioned on the side of the organic EL layer 22 opposite the substrate 10, have functions for carrier injection into the organic EL layer 22 and for connection to an external driving circuit. The first electrode 21, organic EL layer 22, and second electrode 23 form an organic EL element 20. The first electrode 21 and second electrode 23 may respectively be either an anode (hole-injection electrode) or a cathode (electron-injection electrode). However, one among the first electrode 21 and the second electrode 23 is an anode, and the other is a cathode. Further, the first electrode 21 and second electrode 23 may be either a reflective electrode or a transparent electrode, with the condition that one among the two is a transparent electrode. In a top-emission type structure, it is desirable that the first electrode 21 be a reflective electrode, and that the second electrode 23 be a transparent electrode. In a bottom-emission type structure, it is desirable that the second electrode 23 be a reflective electrode, and that the first electrode 21 be a transparent electrode.

The reflective electrode used as the first electrode 21 or second electrode 23 can be formed using a high-reflectivity metal (aluminum, silver, molybdenum, tungsten, nickel, chromium, or similar) or an alloy of these, or an amorphous alloy (NiP, NiB, CrP, or CrB or similar). From the standpoint of enabling a reflectivity for visible light of 80% or higher, particularly preferable materials include silver alloys. Silver alloys which can be used include alloys of silver and at least one type of metal selected from a group comprising group 10 nickel or platinum, group 1 rubidium, and group 14 lead, and alloys of silver and at least one type of metal selected from a group comprising group 2 magnesium and calcium.

The transparent electrode used as the first electrode 21 or second electrode 23 can be formed using $SnO_2$, $In_2O_3$, In—Sn oxides, In—Zn oxides, ZnO, or Zn—Al oxides or other conductive metal oxides. Because the transparent electrode is a path to extract light emitted from the organic EL layer to the outside, it is desirable that the transmissivity in the wavelength range from 400 to 800 nm be 50% or higher, and preferably be 85% or higher.

The first electrode 21 and second electrode 23 can be formed using an evaporation deposition method using a resistive heating technique or an electron beam heating technique, or using a sputtering method. In the case of an evaporation deposition method, film deposition can be performed at film deposition rates of 0.1 to 100 nm/sec at a pressure of $1.0 \times 10^{-4}$ Pa or lower. On the other hand, in the case of a DC magnetron sputtering method or another sputtering method, Ar or another inert gas is used as the sputtering gas, and film deposition can be performed at a pressure of approximately 0.1 to 2.0 Pa. When forming the second electrode 23 using a sputtering method, in order to prevent degradation of the organic EL layer 22 which is the surface of the substrate onto which the film is deposited, it is preferable that the organic EL layer 22 not be directly exposed to plasma formed close to the target.

In order to prevent electrode short-circuits, an electrode separation wall may be formed on the first electrode 21. An electrode separation wall has a cross-sectional shape with a reverse taper. An electrode separation wall can be formed using a CVD method or a sputtering method.

The organic EL layer 22 is positioned between the first electrode 21 and the second electrode 23, is in contact with both these electrodes, and is the layer service as the core of the emission portion. The organic EL layer 22 includes at least an emission layer, and includes, as necessary, a hole transport layer, hole injection layer, electron transport layer, and/or electron injection layer. For example, the organic EL layer 22 can have layer configurations such as the following.

(1) Anode/emission layer/cathode.

(2) Anode/hole injection layer/emission layer/cathode.

(3) Anode/emission layer/electron injection layer/cathode.

(4) Anode/hole injection layer/emission layer/electron injection layer/cathode.

(5) Anode/hole transport layer/emission layer/electron injection layer/cathode.

(6) Anode/hole injection layer/hole transport layer/emission layer/electron injection layer/cathode.

(7) Anode/hole injection layer/hole transport layer/emission layer/electron transport layer/electron injection layer/cathode.

In each of the above configurations (1) to (7), the anode and the cathode may respectively be either the first electrode 21 or the second electrode 23.

An emission layer can be formed using well-known materials. Materials to obtain emission of blue to blue-green light include, for example, fluorescent whitening agents such as benzothiazole system compounds, benzoimidazole system compounds, or benzoxazole system compounds; metal chelate oxonium compounds such as aluminum complexes, of which tris(8-hydroxyquinolinato) aluminum complex ($Alq_3$) is representative; styryl benzene system compounds such as 4,4'-bis(diphenylvinyl) biphenyl (DPVBi); aromatic dimethyldiene system compounds; fused aromatic ring compounds; ring assembly compounds; porphyrin system compounds; and similar.

Or, by adding a dopant to a host compound, an emission layer which emits light in various wavelength ranges can be formed. In this case, as the host compound, a distyryl arylene system compound, N,N'-ditolyl-N,N'-diphenyl biphenylamine (TPD), $Alq_3$, or similar can be used. On the other hand, as the dopant, perylene (blue-purple), coumarin 6 (blue), quinacridone system compounds (blue-green to green), rubrene (yellow), 4-dicyanomethylene-2-(p-dimethyl amino styryl)-6-methyl-4H-pyran (DCM, red), platinum octaethylporphyrin complex (PtOEP, red), and similar can be used.

A hole transport layer can be formed using a material having a triarylamine partial structure, a carbazole partial structure, or an oxadiazole partial structure. Preferred materials for a hole transport layer include TPD, 4,4'-bis[N-(1-naphthyl)-N-phenylamino]biphenyl (α-NPD), MTDAPB (o-, m-, p-), m-MTDATA, and similar. A hole injection layer can be formed using a phthalocyanine (Pc) including copper phthalocyanine complex (CuPc) and similar, an indanthrene system compound, and similar.

An electron transport layer can be formed using an aluminum complex such as $Alq_3$, oxadiazole derivatives such as PBD or TPOB, triazole derivatives such as TAZ, triazine derivatives, phenylquinoxalins, thiophene derivatives such as BMB-2T, and similar materials. An electron injection layer can be formed using an aluminum complex such as $Alq_3$, or an aluminum quinolinol complex doped with an alkali metal or alkaline earth metal, or a similar material.

In addition to the above constituent layers, a buffer layer to raise the carrier injection efficiency can further be optionally formed between the organic EL layer 22 and either a first electrode 21 or a second electrode 23 used as the cathode. A buffer layer can be formed using a material with electron injection properties such as an alkali metal, an alkaline earth metal, an alloy of these, or a rare earth metal, or a fluoride of these metals, or similar.

Further, in order to mitigate damage at the time of formation of the second electrode 23, it is preferable that a damage mitigation layer, comprising MgAg or similar, be formed on the surface of the organic EL layer 22.

It is important that each of the layers forming the organic EL layer 22 have a film thickness sufficient to realize the desired characteristics. It is desirable that the emission layer, hole transport layer, electron transport layer, and electron injection layer have film thicknesses of from 2 to 50 nm, and that the hole injection layer have a film thickness of from 2 to 200 nm. Further, from the standpoints of lowering the driving voltage and improving transparency, it is preferable that an optional buffer layer have a film thickness of 10 nm or less.

Each of the constituent layers of the organic EL layer 22, the buffer layer, and the damage mitigation layer can be manufactured using arbitrary means known in the art, such as evaporation deposition (resistive-heating evaporation deposition or electron beam-heating evaporation deposition).

A color conversion filter layer 40 is a layer to adjust the hue of light emitted from the organic EL layer 22. In this invention, "color conversion filter layer" is a general term for a color filter layer, a color conversion layer, or a layered member of a color filter layer and a color conversion layer.

A color filter layer is a layer which transmits light in a particular wavelength range. A color filter layer has a function for improving the color purity of light from the organic EL layer 22 or from a color conversion layer. A color filter layer can be formed using commercially marketed color filter materials for flat panel displays (for example, Color Mosaic, manufactured by Fujifilm Electronic Materials Co., Ltd., or similar). In forming a color filter layer, spin coating, roll coating, casting, dip coating, or other application methods can be used. A film formed by an application method may be patterned using a photolithography method or similar, to form a color filter layer having a desired pattern.

A color conversion layer is a layer which absorbs light in a particular wavelength range and performs wavelength distribution conversion, to emit light in a different wavelength range. A color conversion layer includes at least a fluorescent dye, and may include a matrix resin as necessary. A fluorescent dye absorbs light from the organic EL layer 22, and emits light in a desired wavelength range (for example, the red range, the green range, or the blue range).

Fluorescent dyes which absorb light in the blue to blue-green range and emit fluorescent light in the red range include, for example, Rhodamine B, Rhodamine 6G, Rhodamine 3B, Rhodamine 101, Rhodamine 110, Sulforhodamine, Basic Violet 11, Basic Red 2, and other rhodamine system dyes; cyanine system dyes; 1-ethyl-2-[4-(p-dimethylaminophenyl)-1,3-butadienyl]-pyridinium-perchlorate (Pyridine 1), and other pyridine system dyes; and oxazine system dyes. Or, various dyestuffs having fluorescent properties such as described above (direct dyestuffs, acid dyestuffs, basic dyestuffs, disperse dyestuffs, and similar), may be used.

Fluorescent dyes which absorb light in the blue to blue-green range and emit fluorescent light in the green range include, for example, 3-(2'-benzothiazolyl)-7-diethylamino coumarin (coumarin 6), 3-(2'-benzimidazolyl)-7-diethyl amino coumarin (coumarin 7), 3-(2'-N-methylbenzimidazolyl)-7-diethylamino coumarin (coumarin 30), 2,3,5,6-1H, 4H-tetrahydro-8-trifluormethylquinolizin (9,9a,1-gh) coumarin (coumarin 153), and other coumarin system dyes; Solvent Yellow 11, Solvent Yellow 116, and other naphthalimido system dyes; and, Basic Yellow 51 and other coumarin dye system dyestuffs. Or, various dyestuffs having fluorescent properties such as described above (direct dyestuffs, acid dyestuffs, basic dyestuffs, disperse dyestuffs, and similar), may be used.

As a matrix resin of a color conversion layer, an acrylic resin, various silicone polymers, or arbitrary materials which can be substituted for these can be used. For example, as a matrix resin, a straight-type silicone polymer, or a denatured resin-type silicone polymer can be used.

A color conversion layer can be formed using a spin coating, roll coating, casting, dip coating, or other application method, or using an evaporation deposition method. When using a plurality of types of fluorescent dyes to form a color conversion layer, the plurality of types of fluorescent dyes and the matrix resin can be mixed in a prescribed ratio to form a preliminary mixture, and this preliminary mixture can be used to perform evaporation deposition. Or, a co-evaporation deposition method may be used to form a color conversion layer. In co-evaporation deposition, each of a plurality of types of fluorescent dyes is arranged at a separate heating position, and each is separately heated to perform co-evaporation deposition. As necessary, a mixture of fluorescent dyes and a matrix resin can be arranged at a heating position and used as an evaporation source. In particular, when the characteristics of the plurality of types of fluorescent dyes (evaporation deposition rates and/or vapor pressures, or similar) differ greatly, use of a co-evaporation deposition method is advantageous.

When a color conversion filter layer 40 is formed between the substrate 10 and the first electrode 21, it is desirable that a planarization layer 50 be formed so as to cover the color conversion filter layer 40. A planarization layer 50 is effective for flattening the surface in order to form the organic EL element 20, and for preventing the occurrence of line breaks, short-circuits, and other malfunctions in the organic EL element. A planarization layer 50 can be formed using a photosetting resin, photo/thermosetting resin, thermosetting resin, thermoplastic resin, or similar. A planarization layer 50 can be formed using spin coating, roll coating, casting, dip coating, or another application method.

In order to prevent diffusion of residual water included in this planarization layer 50 to the organic EL layer 22, a passivation layer 60 may be formed so as to cover the planarization layer 50. A passivation layer 60 can be formed using an insulating oxide ($SiO_x$, $TiO_2$, $ZrO_2$, $AlO_x$, and similar), an insulating nitride ($AlN_x$, $SiN_x$, and similar), or an inorganic oxide-nitride (SiON and similar). A passivation layer 60 can be formed using a method such as plasma CVD.

In order to prevent permeation of oxygen and water into the organic EL element 20, in this invention a sealing film 30 is formed on the second electrode 23 and electrode separation wall. Details are as described above.

Next, a method of manufacturing an organic EL device of this invention is explained. First, a substrate 10 is prepared. On the substrate 10 is formed an organic EL element 20, in which an organic EL layer 22 is enclosed by a first electrode 21 and a second electrode 23; and a sealing film 30 is further formed. When forming a color conversion filter layer 40, formation is between the substrate 10 and the first electrode 21. When forming this color conversion filter layer 40, it is desirable that a planarization layer 50 be formed so as to cover the color conversion filter layer 40. Also, a passivation layer 60 may also be formed so as to cover the planarization layer 50.

FIG. 2 is an example of an organic EL device comprising a single emission portion. However, an organic EL device of this invention may comprise a plurality of independently controlled emission portions. For example, the first electrode and second electrode may both be an electrode group comprising a plurality of stripe-shape electrodes, with the direction of extension of the stripe-shape electrodes forming the first electrode and the direction of extension of the stripe-shape electrodes forming the second electrode made to intersect, to form a so-called passive matrix-driven organic EL device. Here, in a display application which displays an arbitrary image and/or character, it is preferable that the direction of extension of the stripe-shape electrodes forming the first electrode and the direction of extension of the stripe-shape electrodes forming the second electrode be perpendicular. Or, the first electrode may be divided into a plurality of partial electrodes, each of the plurality of partial electrodes may be connected one-to-one with a switching element formed on the substrate, and using the second electrode as an integral common electrode, a so-called active matrix-driven organic EL device may be formed.

In the cases of either a passive matrix-driven device or an active matrix-driven device, it is desirable that an insulating film be provided between the plurality of partial electrodes forming the first electrode. An insulating film can be formed using an insulating oxide ($SiO_x$, $TiO_2$, $ZrO_2$, $AlO_x$, or similar), an insulating nitride ($AlN_x$, $SiN_x$, or similar), or a polymer material or similar.

Further, in a configuration having a plurality of independently controlled emission portions, a plurality of types of color conversion filter layers can be used to form an organic EL device capable of multicolor display. For example, using red, green, and blue color conversion filter layers, red, green, and blue subpixels can be formed, and by arranging pixels having sets of subpixels with the three colors in a matrix shape, an organic EL device capable of full-color display can be formed.

In the case of a top-emission type organic EL device, an organic EL element, in which an organic EL layer is enclosed between a first electrode and a second electrode, is formed on a substrate comprising thin film transistors and similar, and a sealing film comprising silicon nitride is also formed. Then, a substrate on which are formed a color filter layer and CCM layer (color conversion layer) is bonded with the face opposite the face of the organic EL element side having the sealing film, to obtain [the organic EL device].

PRACTICAL EXAMPLES

Below, the invention is explained in still more detail by presenting practical examples of the invention and comparison examples; however, the invention is not limited to these examples.

Optimization of Film Deposition Rate—

TEST EXAMPLE 1a

A 3 μm silicon nitride film was deposited onto a Si wafer on which a pattern of depressions and protrusions of depth 1 μm had been formed with a laser, and SEM observations of the cross-section were performed. The film deposition conditions were an Rf output of 1.0 kW, an $SiH_4$ gas flow rate of 60 sccm, an $NH_3$ gas flow rate of 50 sccm, an $N_2$ gas flow rate of 2500 sccm, and a film deposition rate of 2.80 nm/sec.

In the evaluation method, at the edge portions of the pattern of depressions and protrusions, a cracked state was denoted by an x, a depression in the surface of the silicon nitride film without a crack was denoted by a Δ, and a state of uniform coverage was denoted by a O. Observation results are shown in Table 1.

TEST EXAMPLES 1b and 1c

The film deposition conditions described in Table 1 were used to perform tests similarly to Test Example 1a. Film deposition conditions and observation results are shown in Table 1.

TABLE 1

| | Rf output (kW) | $SiH_4$ (sccm) | $NH_3$ (sccm) | $N_2$ (sccm) | Film deposition rate (nm/sec) | Observation result |
|---|---|---|---|---|---|---|
| Test Example 1a | 1.0 | 60 | 50 | 2500 | 2.80 | O |
| Test Example 1b | 1.2 | 60 | 50 | 2500 | 3.01 | Δ |
| Test Example 1c | 1.4 | 150 | 80 | 3000 | 3.58 | X |

From Table 1, in Test Example 1a the silicon nitride film reliably covered the pattern of depressions and protrusions. In Test Example 1b, portions of the silicon nitride film on the depressions and protrusions had reduced film thickness. In Test Example 1c, cracking was seen in portions at corners of depressions and protrusions. Hence it was demonstrate that a film deposition rate of 2.8 nm/sec or below is preferable.

Optimization of the Hydrogen Addition Amount Relative to the Nitrogen Flow Rate—

TEST EXAMPLE 2a

An evaporation deposition method was used to deposit a calcium (Ca) film of film thickness approximately 100 nm onto a glass substrate 50 mm on a side. Then, with exposure to the atmosphere, a CVD method was used to deposit a silicon nitride film of film thickness 3 μm onto the calcium film via a glove box managed in an nitrogen atmosphere. Film deposition conditions were a $SiH_4$ gas flow rate of 60 sccm, $NH_3$ gas flow rate of 50 sccm, $N_2$ gas flow rate of 2500 sccm, and $H_2$ gas flow rate of 0 sccm. The sample obtained was left in a constant-temperature container at 95° C. and 50 RH % for 1000 hours, and the area ratio of unaltered portions of the calcium film after being left for 1000 hours was measured. Measurement results appear in Table 2.

TEST EXAMPLES 2b to 2g

The film deposition conditions described in Table 2 were used to perform tests similarly to Test Example 2a. Film deposition conditions and observation results are shown in Table 2.

TABLE 2

| | $SiH_4$ (sccm) | $NH_3$ (sccm) | $N_2$ (sccm) | $H_2$ (sccm) | Fraction of $H_2$ relative to $N_2$ (%) | Area ratio of unaltered portion (%) |
|---|---|---|---|---|---|---|
| Test Example 2a | 60 | 50 | 2500 | 0 | 0 | 50 |
| Test Example 2b | 60 | 50 | 2500 | 30 | 1 | 95 |

TABLE 2-continued

|  | SiH$_4$ (sccm) | NH$_3$ (sccm) | N$_2$ (sccm) | H$_2$ (sccm) | Fraction of H$_2$ relative to N$_2$ (%) | Area ratio of unaltered portion (%) |
|---|---|---|---|---|---|---|
| Test Example 2c | 60 | 50 | 2500 | 75 | 3 | 95 |
| Test Example 2d | 60 | 50 | 2500 | 125 | 5 | 95 |
| Test Example 2e | 60 | 50 | 2500 | 130 | 5.2 | 50 |
| Test Example 2f | 60 | 50 | 2500 | 200 | 8 | 30 |
| Test Example 2g | 60 | 50 | 2500 | 400 | 17 | 30 |

From Table 2, when the hydrogen addition amount was 125 sccm or lower, the area ratio of the unaltered portion had a high value, and when the hydrogen addition amount exceeded 130 sccm, the area ratio of the unaltered portion was low.

Relation Between Gas Pressure During Film Deposition and Internal Stress of Silicon Nitride Film—

Figure 3:
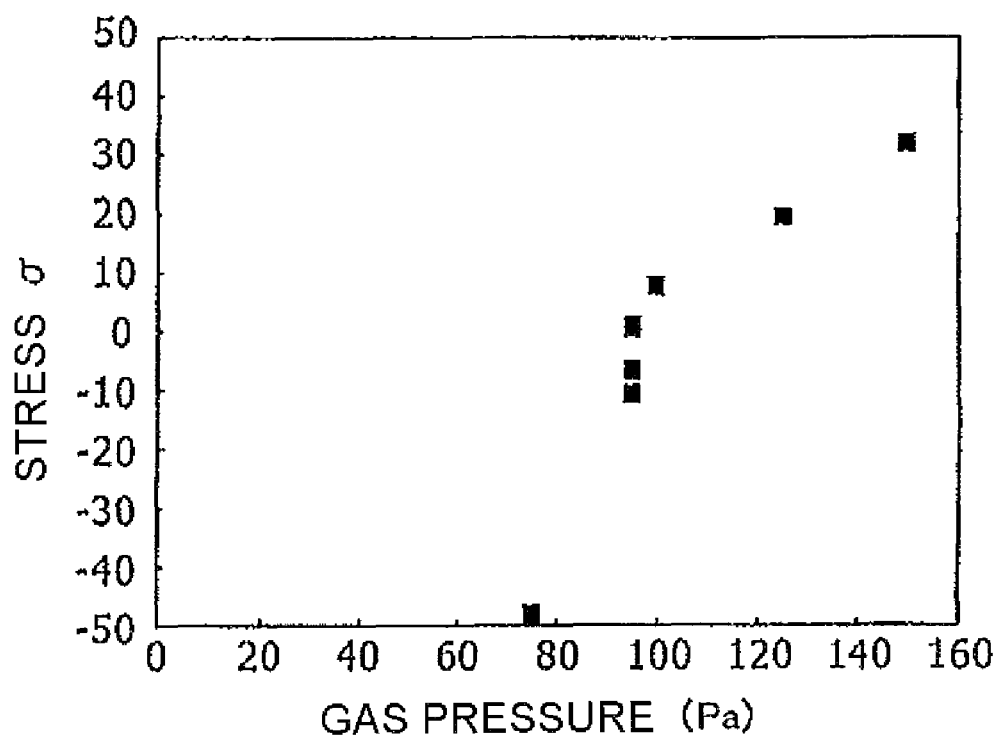
FIG. 3 is a graph showing the relation between gas pressure and internal stress during deposition of a silicon nitride film.

Using a CVD method, with the film deposition conditions of a SiH$_4$ gas flow rate of 60 sccm, NH$_3$ gas flow rate of 50 sccm, N$_2$ gas flow rate of 2500 sccm, and with no H$_2$ gas added, a silicon nitride film was deposited. The gas pressure during film deposition was varied, and the internal stresses of the silicon nitride film obtained at different gas pressures were measured. The internal stress was measured using an optical non-contact bowing measuring method. FIG. 3 shows the relation between the gas pressure during film deposition and the internal stress of the silicon nitride film.

When the stress is on the positive side, force on the silicon nitride film acts in the tension direction, and when the stress is on the negative side, force on the silicon nitride film acts in the compression direction. From FIG. 3, a tendency was observed for the internal stress to be in the tension direction for higher gas pressures during film deposition. When the gas pressure was 100 Pa, the internal stress was ±10 MPa, and this was found to be the condition at which the internal stress was lowest.

Based on the conditions of FIG. 3, a CVD method was used to deposit a 3 µm silicon nitride film on a Si wafer by adjusting the gas conditions such that the stress exceeded ±50 MPa. The sample obtained was immersed for 30 minutes in an aqueous solution of 20 weight percent potassium hydroxide at a temperature of 75° C. For comparison, a silicon nitride film with stress of 0 MPa was deposited by a similar method, and the sample obtained was similarly immersed.

As a result, when the stress exceeded +50 MPa, immersion caused the silicon nitride film to separate completely. When the stress was less than −50 MPa, cracks occurred over the entire face of the silicon nitride film.

PRACTICAL EXAMPLE 1

In order to emit light with the three colors red, green and blue (hereafter "RGB"), a color filter layer and CCM layer (color conversion layer) were formed on a substrate. Then, a polyimide denatured silicone resin was used to form a planarization layer. Next, a sputtering method was used to deposit an SiO$_2$ film, which was a second oxide layer, to a film thickness of 300 nm. As the sputtering target, a boron-doped Si target was used; as the sputtering gas, a gas mixture of Ar and O$_2$ was used. Next, a DC sputtering method (target: IZO (In$_2$O$_3$-10% ZnO), sputtering gas: Ar, power: 250 W) was used to deposit IZO to a thickness of 220 nm to form an anode, and photolithography was used to form the IZO in a prescribed pattern. Then, a photo process was used to form a shadow mask such that windows were opened at emission positions. The size of the mask opening portions was approximately 80×240 µm. Next, a cathode separation wall was arranged in the gaps of windows of the shadow mask aligned on the IZO data lines, in the direction perpendicular to the IZO, and a matrix driving structure was manufactured. Next, after using evaporation deposition to form an organic EL layer in vacuum, an Al electrode of film thickness 200 nm was formed in a pattern perpendicular to the IZO, without breaking the vacuum. Next, loading into a parallel-plate type CVD device was performed in a dry nitrogen atmosphere so as not to expose the organic EL layer to the atmosphere, and a silicon nitride film was deposited. The film deposition conditions were a SiH$_4$ gas flow rate of 60 sccm, NH$_3$ gas flow rate of 50 sccm, N$_2$ gas flow rate of 2500 sccm, H$_2$ gas flow rate of 30 sccm, gas pressure of 100 Pa, and RF applied power of 1000 W. The silicon nitride film internal stress at this time was −20 Pa. The substrate stage temperature was made 80° C., and the film deposition time was adjusted such that the film thickness of the silicon nitride film was 3000 nm. The refractive index of the silicon nitride film was 1.88. Thereafter, a glass substrate and UV hardening adhesive were used to perform sealing within a glove box.

COMPARATIVE EXAMPLE 1

The film deposition conditions for the silicon nitride film were a SiH$_4$ gas flow rate of 60 sccm, NH$_3$ gas flow rate of 50 sccm, N$_2$ gas flow rate of 2500 sccm, H$_2$ gas flow rate of 300 sccm, gas pressure of 145 Pa, and RF applied power of 1000 W. The substrate stage temperature was 80° C., and the film deposition time was adjusted such that the film thickness of the silicon nitride film was 3000 nm. The refractive index of the silicon nitride film was 1.91. Other conditions were similar to those of Practical Example 1.

COMPARATIVE EXAMPLE 2

The film deposition conditions for the silicon nitride film were a SiH$_4$ gas flow rate of 60 sccm, NH$_3$ gas flow rate of 50 sccm, N$_2$ gas flow rate of 2500 sccm, no H$_2$ gas added, gas pressure of 90 Pa, and RF applied power of 1000 W. The internal stress of the silicon nitride film was −60 Pa. The substrate stage temperature was 80° C., and the film deposition time was adjusted such that the film thickness of the silicon nitride film was 3000 nm. The refractive index of the silicon nitride film was 1.88. Other conditions were similar to those of Practical Example 1.

Reliability evaluations of the organic EL displays obtained in Practical Example 1 and Comparative Examples 1 and 2 were performed. The organic EL displays obtained were left for 1000 hours in a 60° C., 95 RH % environment, and after being left for 1000 hours, the number of dark spots per 100 cm$^2$ was observed, and 300 pixels' worth of the dark spots observed were collected and the average value thereof was calculated. The calculation results are shown in Table 3.

TABLE 3

|  | Number of dark spots |
| --- | --- |
| Practical Example 1 | 0.05 |
| Comparative Example 1 | 6 |
| Comparative Example 2 | 2 |

From Table 3, it is shown that compared with Comparative Examples 1 and 2, the number of dark spots in the organic EL display obtained in Practical Example 1 could be suppressed.

The invention claimed is:

1. An organic EL device, comprising:
a substrate;
an organic EL element formed on the substrate; and
a sealing film formed on the organic EL element,
wherein the sealing film is a CVD-deposited silicon nitride film containing from 0.85 at % to 0.95 at % of H.

2. The organic EL device according to claim 1, wherein the silicon nitride film has a film thickness ranging from 1000 to 5000 nm.

3. The organic EL device according to claim 1, wherein the silicon nitride film has an absolute value of an internal stress that is 50 MPa or lower.

4. A method of manufacturing the organic EL device according to claim 1, the method comprising the steps of:
forming an organic EL element on a substrate; and
forming a sealing film on the organic EL element in a process including mixing $SiH_4$, $NH_3$, $N_2$, and $H_2$ during which the $H_2$ is introduced at a flow rate set to from 1 volume percent to 5 volume percent of that of the $N_2$ so that a silicon nitride film containing hydrogen atoms or hydrogen molecules is formed.

5. The method of manufacturing an organic EL device according to claim 4, wherein the silicon nitride film is formed at a film deposition rate of 2.8 nm/sec or lower.

6. An organic EL device having barrier properties with respect to water and oxygen, comprising:
a substrate;
an organic EL element formed on the substrate; and
a SiNH sealing film formed on the organic EL element as a CVD-deposited SiNH film comprised of silicon, nitrogen, and from 0.85 at % to 0.95 at % of hydrogen, and having a film thickness effective to provide said barrier properties with respect to water and oxygen so that dark spot formation is suppressed.

7. The organic EL device according to claim 6, wherein the silicon nitride film has a film thickness ranging from 1000 nm to 5000 nm.

8. The organic EL device according to claim 6, wherein the silicon nitride film has an absolute value of an internal stress that is 50 MPa or lower.

9. A method of manufacturing the organic EL device according to claim 6, the method comprising the steps of:
forming an organic EL element on a substrate; and
forming a CVD-deposited sealing film on the organic EL element in a CVD deposition process including mixing $SiH_4$, $NH_3$, $N_2$, and $H_2$ during which the $H_2$ is introduced at a flow rate set to from 1 volume percent to 5 volume percent of that of the $N_2$ so that a CVD-deposited silicon nitride film containing hydrogen atoms or hydrogen molecules is formed having a film thickness effective to provide barrier properties with respect to water and oxygen so that dark spot formation is suppressed.

10. The method of manufacturing an organic EL device according to claim 9, wherein the silicon nitride film is formed at a film deposition rate of 2.8 nm/sec or lower.

* * * * *